(12) United States Patent
Sung et al.

(10) Patent No.: US 6,469,341 B1
(45) Date of Patent: Oct. 22, 2002

(54) METHOD AND DEVICE FOR PRODUCING UNDERCUT GATE FOR FLASH MEMORY

(75) Inventors: Kuo-Tung Sung, Hsinchu (TW); Ray C. Lee, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 48 days.

(21) Appl. No.: 09/625,143

(22) Filed: Jul. 25, 2000

Related U.S. Application Data

(62) Division of application No. 09/075,852, filed on May 11, 1998, now Pat. No. 6,136,653.

(51) Int. Cl.⁷ ............... H01L 21/8247; H01L 29/788
(52) U.S. Cl. ............... 257/316; 438/266; 438/593
(58) Field of Search ............... 257/315, 316, 257/321

(56) References Cited

U.S. PATENT DOCUMENTS

| | | | |
|---|---|---|---|
| 5,066,902 A | 11/1991 | Wu et al. | 357/23.5 |
| 5,202,850 A | 4/1993 | Jenq | 365/185 |
| 5,278,087 A | 1/1994 | Jenq | 437/43 |
| 5,440,159 A | 8/1995 | Larsen et al. | 257/318 |
| RE35,094 E | 11/1995 | Wu et al. | 437/43 |
| 5,488,244 A * | 1/1996 | Quek et al. | 257/314 |
| 5,493,534 A | 2/1996 | Mok | 365/226 |
| 5,587,951 A | 12/1996 | Jazayeri et al. | 365/203 |
| 5,606,532 A | 2/1997 | Lambrache et al. | 365/238.5 |
| 5,658,814 A | 8/1997 | Lee | 438/588 |
| 5,680,346 A | 10/1997 | Pathak et al. | 365/185.1 |
| 5,686,333 A | 11/1997 | Sato | 437/43 |
| 5,756,384 A | 5/1998 | Tseng | 438/257 |
| 5,885,871 A | 3/1999 | Chan et al. | 438/265 |
| 5,911,106 A | 6/1999 | Tasaka | 438/276 |
| 5,918,125 A | 6/1999 | Guo et al. | 438/264 |
| 5,972,753 A | 10/1999 | Lin et al. | 438/265 |
| 5,973,353 A * | 10/1999 | Yang et al. | 257/315 |
| 5,981,339 A * | 11/1999 | Chang et al. | 438/257 |
| 5,981,366 A | 11/1999 | Koyama et al. | 438/593 |

OTHER PUBLICATIONS

Stanley Wolf, Ph.D., *Silicon Processing for the VLSI ERA, vol. II: Process Integration*, (1990), Lattice Press, pp. 634–635.

* cited by examiner

Primary Examiner—Richard Booth
(74) Attorney, Agent, or Firm—Townsend and Townsend and Crew, LLP

(57) ABSTRACT

A method and resulting integrated circuit device (100) such as a flash memory device and resulting cell. The method includes a step of providing a substrate (115), which has an active region overlying a thin layer of dielectric material (113). The method uses a step of forming a floating gate layer (107) overlying the thin layer of dielectric material (113), which is commonly termed a "tunnel oxide" layer, but is not limited to such a layer or material. The floating gate layer (107) has novel geometric features including slant edges (121), which extend to the dielectric material (123). The slant edges (121) create a smaller geometric area for the tunnel oxide region relative to the area between the floating gate layer and the control gate layer.

18 Claims, 5 Drawing Sheets

METHOD AND DEVICE FOR PRODUCING UNDERCUT GATE FOR FLASH MEMORY

This is a division of application Ser. No. 09/075,852, filed May 11, 1998, now U.S. Pat. No. 6,136,653.

BACKGROUND OF THE INVENTION

The present invention relates to the manufacture of semiconductor integrated circuits. More particularly, the invention is illustrated with regard to memory cell structures for a flash memory cell or flash $E^2PROM$ or EPROM cell, but it will be recognized that the invention has a wider range of applicability. Merely by way of example, the present invention can be applied to a variety of embedded memory cell structures such as microprocessors ("MICROs"), microcontrollers, application specific integrated circuits ("ASICs"), and the like.

A variety of memory devices have been proposed or used in industry. An example of such a memory device is an erasable programmable read-only memory ("EPROM") device. The EPROM device is both readable and erasable, i.e., programmable. In particular, an EPROM is implemented using a floating gate field effect transistor, which has binary states. That is, a binary state is represented by the presence or absence of charge on the floating gate. The charge is generally sufficient to prevent conduction even when a normal high signal is applied to the gate of the EPROM transistor.

Numerous varieties of EPROMs are available. In the traditional and most basic form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "$E^2PROM$"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

A limitation with the flash memory cell is that high voltage is often required to program the device. In some conventional devices, the high voltage can be up to double the amount of voltage needed to operate the device. As device size becomes smaller, high voltage is often detrimental to the operation of the device, as well as its reliability. In particular, high voltages often require a high voltage supply, which uses a more efficient voltage pump. This voltage pump generally requires a thicker oxide for the transistor device, which is often more difficult to make accurately. Additionally, higher voltages often lead to reliability and quality problems. These and other limitations exist in conventional flash memory devices. From the above it is seen that a flash memory cell structure that is easy to fabricate, cost effective, and reliable is often desired.

SUMMARY OF THE INVENTION

The present invention provides a technique, including a method and device, for an improved floating gate structure of a flash memory cell in an integrated circuit device. This improved floating gate structure is provided with a higher surface area that is capacitively coupled to a control gate by way of an undercut gate structure. The undercut gate structure provides a higher gate coupling ratio, which is a desirable result.

In a specific embodiment, the present invention provides a method of fabricating an integrated circuit device such as a flash memory device and resulting cell. The method includes a step of providing a substrate, which has an active region over which lies a thin layer of dielectric material, which is commonly termed a "tunnel oxide" layer, but is not limited to such a layer or material. The method uses a step of forming a floating gate layer overlying the thin layer of dielectric material. The floating gate layer has novel geometric features including undercut edges, also called slant edges, which are made by way of plasma etching techniques, which would generally be considered undesirable using conventional process structures. The slant edges extend from an upper surface of the floating gate layer to the dielectric material, where the upper surface is much larger in surface area than the surface area overlying the tunnel oxide layer. That is, the slant edges create a smaller "footprint" overlying the tunnel oxide layer relative to the region of the floating gate which is capacitively coupled to a control gate layer. By way of the smaller footprint, the device has desirable characteristics.

In an alternative embodiment, the present invention provides a novel semiconductor device structure for a flash memory cell. The memory cell includes a variety of features such as a substrate, which has an active region over which lies a layer of dielectric material. This dielectric layer is termed the tunnel oxide layer, but is not limited to this material. A floating gate layer is formed overlying the tunnel oxide layer in the active region. The floating gate layer has slant edges that extend to the dielectric material. The slant edges can be made using a variety of techniques including plasma etching, which may have anisotropic and isotropic characteristics. The slant edges create a smaller geometric area for the tunnel oxide region relative to the area between the floating gate layer and the control gate layer, thereby providing some desirable device features.

Numerous benefits are achieved in one or more embodiments of the present invention over previous existing techniques. For example, the present invention provides a relatively simple structure to increase a gate coupling ratio ("GCR") of a flash memory device. The increased gate coupling ratio leads to lower voltages needed to program the device. Additionally, the present invention uses a simple technique for manufacturing the novel flash memory cell. This technique relies on conventional technology, which was generally undesirable in the manufacture of integrated circuits. These and other benefits are described throughout the present specification, and more particularly below.

The present invention achieves these benefits in the context of known process technology. A further understanding of the nature and advantages of the present invention, however, may be realized by reference to the latter portions of the specification and attached drawings.

DESCRIPTION OF THE SPECIFIC EMBODIMENT

I. Conventional Device Structure

Figure 1:
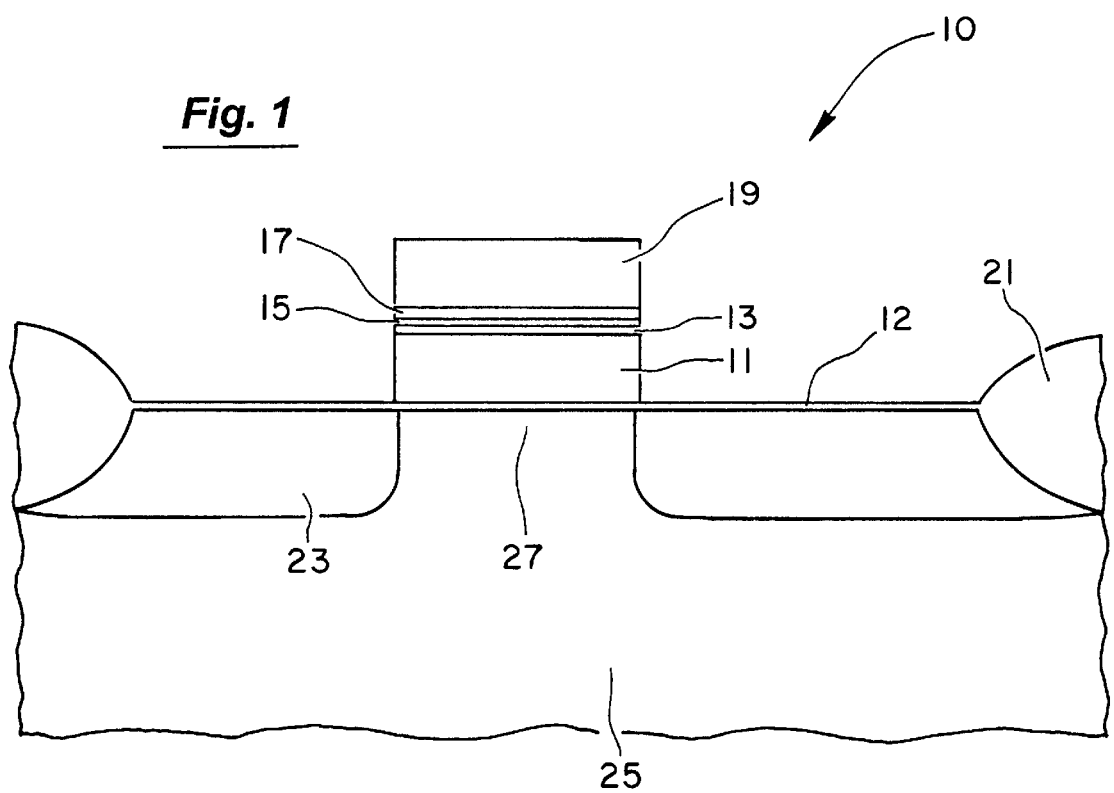
FIG. 1 is a simplified cross-sectional view diagram of a conventional flash memory device.

FIG. 1 is a simplified cross-sectional view diagram of a conventional flash memory device 10. This memory device 10 includes source/drain regions 23, which are defined in substrate 25. Field isolation oxide regions 21 are defined in the substrate 25 to isolate the memory device 10. A gate structure including a floating gate 11 and a control gate 19 is defined overlying an oxide layer 12, which is defined overlying the substrate 25. Oxide layer 12 is commonly termed the "tunnel oxide," since electrons tunnel through the oxide layer to the floating gate. A dielectric layer is sandwiched between the floating gate 11 and the control gate 19. The dielectric layer includes an oxide layer 13, which is defined overlying the floating gate 11. A nitride layer 15 is defined overlying the oxide layer 13. Another oxide layer 17 is defined overlying the nitride layer 15. The combination of the two oxide layers and the nitride layer sandwiched in between is commonly called an "ONO" structure. An example of this memory device is one developed by Intel Corporation ("Intel"). Intel called its process FLOTOX (i.e., FLOating gate Tunneling OXide). Other processes are called, for example, FETMOX, SIMOS, etc., which differ slightly from company to company.

The general storage cell structure includes an access transistor and a double polysilicon storage cell with a floating polysilicon gate isolated in silicon dioxide, which is capacitively coupled to a second polysilicon control gate, which is stacked directly above the floating gate. The memory cell can be used in NMOS, as well as CMOS technology.

The storage cell is erased by Fowler-Nordheim tunneling of electrons. For example, selected voltages are applied to the $V_{DD}$, $V_{BB}$, and $V_{PP}$ to inject electrons through the thin oxide layer from the floating gate to the junction. The floating gate thereby becomes relatively more positively charged. This shifts the threshold voltage in the negative direction so that in the READ mode the transistor will be "on." In the program mode the control gate is at a high voltage while a fixed voltage is applied to the drain junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

Numerous limitations exist in this conventional cell structure. As device size becomes smaller, it becomes advantageous to use lower voltages on the control gate to program the device. Lower voltages are often achieved by way of a higher gate coupling ratio. Gate coupling ratio is defined according to the simplified expression:

$$GCR\ C_{ono}/(C_{tox}+C_{ono})$$

where
GCR is the gate coupling ratio;
$C_{ono}$ is capacitance of the oxide/nitride/oxide; and
$C_{tox}$ is capacitance of the tunnel oxide.

As shown in the above expression, GCR is generally increased by decreasing the thickness of the tunnel oxide layer, which reduces capacitance of such layer. Unfortunately, it is generally impossible to maintain effective device performance having a tunnel oxide thickness of less than about 110 Angstroms for devices having a channel length of less than about 1.5 microns. Additionally, the geometric configuration of the conventional device limits relative area of the tunnel oxide layer to the ONO layer. Accordingly, GCR simply cannot be adjusted in an easy and cost effective manner. Some manufacturers have attempted to provide different geometric configurations from the conventional device shown by FIG. 1, but such configurations often come with the additional expense or limitation in processing the device.

II. Present Device Structure and Method

Figure 2:
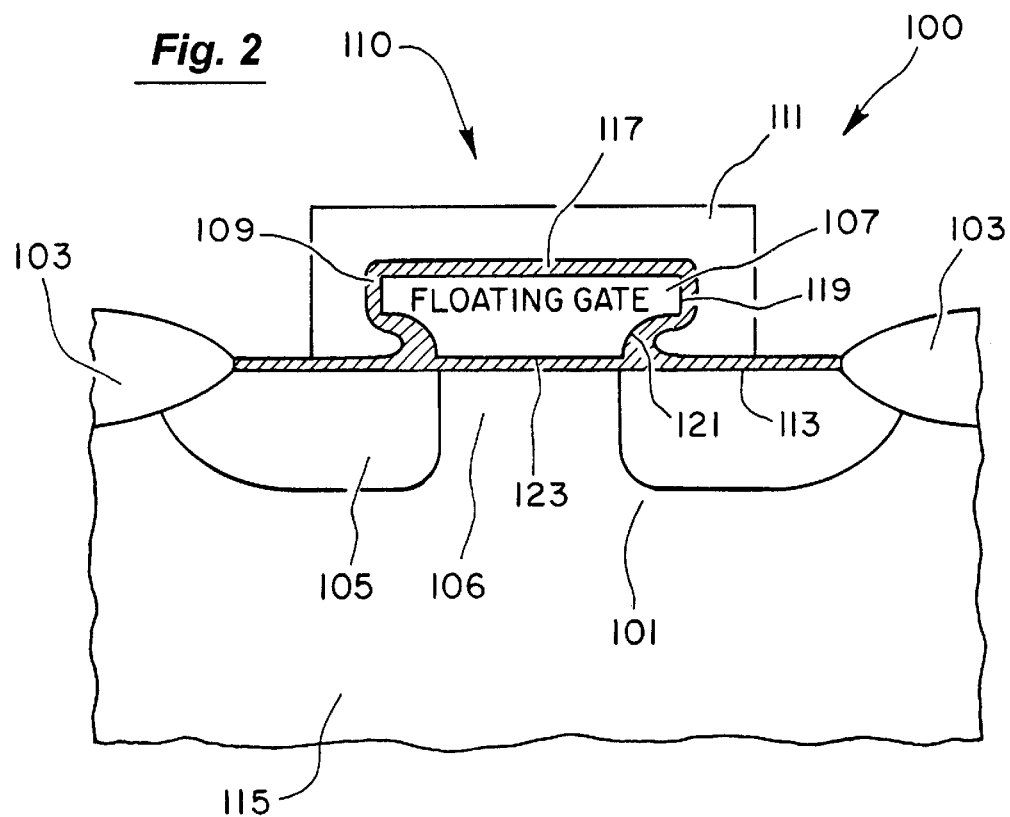
FIG. 2 is a simplified cross-sectional view diagram of a flash memory device according to the present invention.

FIG. 2 is a simplified cross-sectional view diagram of a flash memory device according to the present invention. This diagram is merely an example and should not limit the scope of the claims herein. One of ordinary skill in the art would recognize other alternatives, variations, and modifications. The memory device 100 includes a variety of features such as field isolation oxide regions 103, which are used to isolate the active device regions. The device also includes source/drain regions 105 in a well region 101.

A stacked gate structure 110 is defined overlying a channel region 106. A thin gate dielectric layer 113 is defined overlying channel region 106. The thin gate dielectric layer is often made of a high quality oxide layer such as thermal oxide or the like. The stacked gate structure 110 includes at least two gate structures, including floating gate 107 and control gate 111. The floating gate and the control gate are separated from each other by a dielectric layer 109. This dielectric layer can be a single layer or multiple layers, e.g., oxide on nitride on oxide. Control gate is defined overlying the dielectric layer.

Floating gate 107 is selectively formed to increase GCR in the present device. Floating gate includes a top surface 117, which is adjacent to dielectric layer 109. Floating gate also includes vertical edges 119 which extend from the top surface to under cut regions or slant edges 121. The slant edges extend negatively to the bottom surface 123 of the floating gate, which is defined overlying channel region 106. In some embodiments, the slant edges can extend from the top surface of the floating gate to the bottom surface. That is, the floating gate may be substantially free from any vertical edges. GCR increases by increasing the relative area of the top surface (including edges and slant edges) to the bottom surface. Accordingly, the surface of the floating gate that is capacitively coupled to the control gate is much larger than the surface of the floating gate that is capacitively coupled to the dielectric or tunnel oxide layer.

Ideally, a GCR that approaches one would produce excellent cell performance and reliability characteristics. Practically, however, it is quite difficult for GCR to reach one. Accordingly, GCR in the embodiments of the present invention can range from values greater than 0.5, or greater than 0.6, or greater than 0.7, or greater than 0.8, or greater than 0.9, although GCR is not limited to these values. Of course, the final GCR value will depend upon the particular application.

Accordingly, the present invention provides larger values of GCR using a novel fabrication method. This fabrication method is easier and uses less steps than conventional techniques, which are becoming quite complicated. By way of easier fabrication steps, the present invention may provide higher device yields and better device reliability. As merely an example, the present invention uses previously existing technology, which is often considered undesirable, to form a novel device structure. Details of a method used to fabricate the present invention are discussed below.

Figure 3:
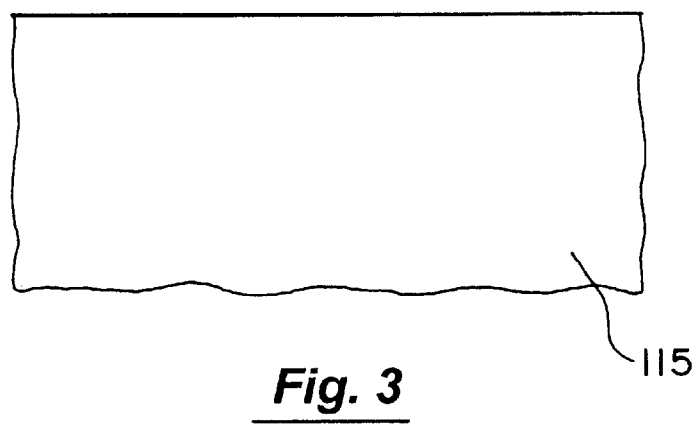
FIGS. 3–5 illustrate a method according to the present invention.
Figure 4:
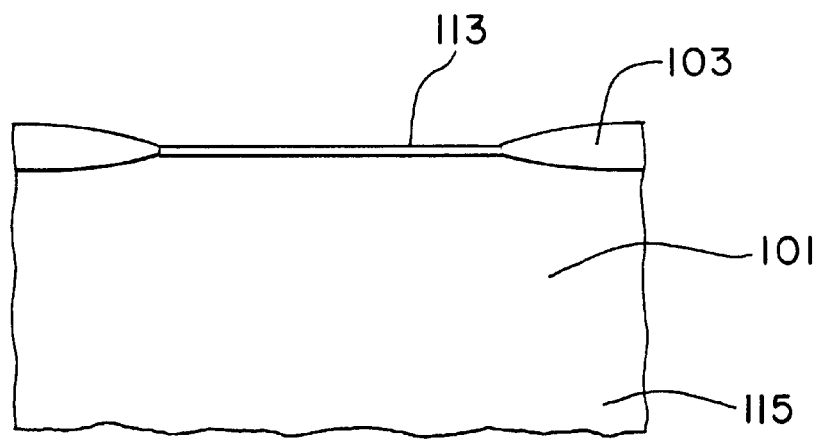
Figure 5:
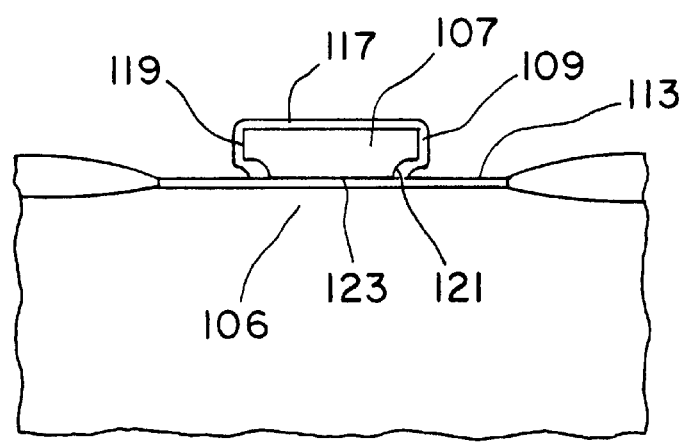

FIGS. 3–5 illustrate a method according to the present invention. This method is merely an example and should not limit the scope of the claims herein. One of ordinary skill in the art would recognize other alternatives, variations, and modifications. As shown, the method begins by providing a semiconductor substrate 115, typically the starting point for the fabrication process. Field oxide regions 103 form onto the semiconductor substrate by use of a technique known in the art, such as the local oxidization of silicon (LOCOS), as shown by FIG. 4. Alternatively, the isolation regions may be trench isolation. Trench isolation can be formed by way of directional or reactive ion etching or milling of the substrate to form trenches or "slits" in the substrate between active regions. These trenches are commonly filled with a dielectric material to isolate a first active region to a second active region. In a CMOS embodiment, for instance, P type well region 101 and N type well region (not shown) are defined onto the semiconductor substrate, which is typically separated by the field oxide region 103. The P type well region 101 and the N type well region define the location for an N type channel device and a P type channel device, respectively.

A gate oxide layer 113 is grown overlying both the P type and N type well regions. The gate oxide layer is typically a thin layer of oxide, but is not limited to the oxide material. Other materials such as silicon oxynitride, silicon nitride, and the like, may also be used. In some embodiments, a step of ion implanting P type conductivity impurities into the substrate defines a buried region, which acts as a channel stop region. The ion implant step is also used to adjust the threshold voltage of each of the devices. The buried channel is of P type conductivity.

A floating gate layer is formed overlying the surface of the gate oxide layer. The gate layer is commonly made of polysilicon and is also known as the poly 1 layer and the like. The gate polysilicon layer is often doped with an N type dopant such as phosphorus and the like. Doping can occur using $POCl_3$ diffusion, in-situ doping techniques, and implantation techniques. The gate polysilicon can be formed in a polycrystalline state or an amorphous state, which is later converted into the polycrystalline state. Amorphous silicon can be formed using low temperatures, e.g., 550 degrees C and less.

A masking step defines floating gate regions from the polysilicon layer 107, as shown by FIG. 5. In particular, the floating gate region is often formed by standard process steps such as masking, exposing, developing, etching, and others. The underlying oxide layer typically acts as an etch stop during the etching step, and often remains overlying both the N type and P type well regions. As illustrated, the floating gate regions include edges having substantially vertical sides and undercut regions. The undercut regions are made by way of plasma processing or wet processing in some cases. Plasma processing occurs using plasma etching tools. These tools can be configured to provide substantially vertical edges and undercut edges. Vertical edges are provided by using an anisotropic etching process. (The undercut edges occur using a slightly isotropic etch or plasma scattering.) Details of this etching process are described below.

Floating gate 107 is selectively formed to increase GCR in the present device. Floating gate includes a top surface 117. Floating gate also includes vertical edges 119 which extend from the top surface to under cut regions or slant edges 121. The slant edges extend negatively to the bottom surface 123 of the floating gate, which is defined overlying channel region 106. Alternatively, slant edges may extend from the top surface to the bottom surface. In some embodiments, the slant edges can also be curved and do not need a linear profile. GCR increases by increasing the relative area of the top surface (including edges and slant edges) to the bottom surface. That is, GCR increases by increasing the area of the floating gate that is capacitively coupled to the control gate relative to the area of the floating gate that is capacitively coupled to the tunnel oxide overlying the active cell region.

Ideally, a GCR that approaches one would produce excellent cell performance and reliability characteristics. Practically, however, it is quite difficult for GCR to reach one. Accordingly, GCR in the embodiments of the present invention can range from values greater than 0.5, or greater than 0.6, or greater than 0.7, or greater than 0.8, or greater than 0.9, although GCR is not limited to these values. The exact value of GCR depends upon the particular geometric configuration of the floating gate as well as the design rule for the device. Of course, the final GCR value will depend upon the particular application.

The floating gate structure can be made using a variety of suitable etching techniques. An etching technique begins by being substantially anisotropic to defined the substantially vertical edges 119. As etching approaches the etch stop layer, it becomes isotropic or directional in a manner to create slant edges 121 or under cut regions. Etching for the polysilicon layer occurs by way of a chlorine bearing compound such as chlorine gas (i.e., $Cl_2$) in a plasma environment. Alternatively, etching occurs using a bromine bearing compound such as hydrogen bromide (i.e., HBr). Etching occurs by way of etching tools such as a TCP etching tool sold by Lam Research of Fremont, Calif. Alternatively, etching can occur using a P5000 etcher made by Applied Materials of Santa Clara, Calif. Depending upon the particular tool and recipe, etching is quite uniform from cell to cell on a particular device. Of course, the type of etcher should not limit the scope of the claims herein.

A dielectric layer 109 forms overlying the surface of the floating gate layer. The dielectric layer can be an oxide layer, a nitride layer, or any combination thereof. In a preferred embodiment, the dielectric layer is a silicon nitride layer, which is sandwiched between two oxide layers. As shown, the dielectric layer forms overlying the top surface, vertical edges, and slant edges of the floating gate layer. The dielectric layer is preferably made by way of thermal oxidation or nitridation or the like. This forms a high quality dielectric layer to isolate and insulate the floating gate layer from a control gate layer.

A control gate layer is defined overlying the dielectric layer to form the structure shown in, for example, FIG. 2. The control gate layer is preferably a polysilicon layer. The polysilicon layer is generally doped with impurities such as an N-type impurity. The N-type impurity is diffused, implanted, or in-situ doped. In most cases, it is desirable to in-situ dope the impurity into the control gate layer to prevent any possible damage to the dielectric layer.

Alternatively, a lower temperature diffusion process may be used to introduce impurities into the control gate layer.

In addition to those steps described above, LDD implants are made to form the N– type and P– type LDD regions. A mask typically of photoresist overlying the top surface of the substrate exposes regions for the N– type LDD implant. The N– type implant forms the N– type LDD regions for an N type channel device. The mask is then stripped by way of standard techniques in the art. Another mask exposes P– type LDD regions for the P– type LDD implant. The P– type implant forms the P– type LDD regions for a P type channel device. The mask is then stripped. Source/drain regions are defined in the memory device. An N+ type implant is made to define source/drain regions of the N– type impurity device. A P+ type implant is made to define source/drain regions of the P–type impurity device. To complete the cell structure, the method undergoes steps of applying an inter-dielectric film overlying the surface region of the memory device of FIG. 2, for example. Contact regions or vias are made in the inter-dielectric film. Remaining fabrications steps are performed to complete the device.

Figure 6:
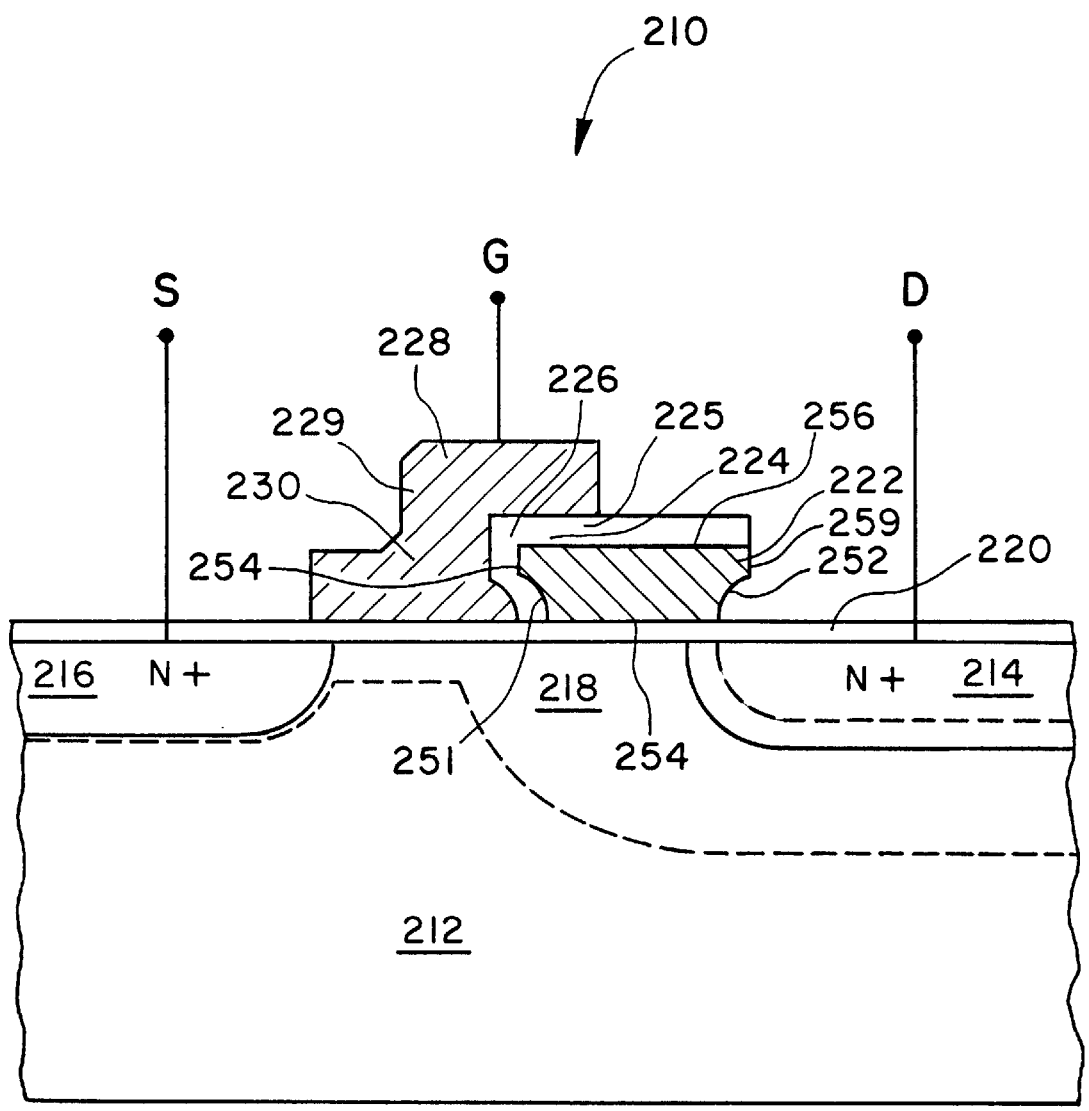
FIGS. 6–10 illustrate examples of flash memory devices according to specific embodiments of the present invention.

FIG. 6 illustrates an example of a flash memory device according to a specific embodiment of the present invention. Referring to FIG. 6, there is shown a single transistor, split-gate non-volatile electrically alterable semiconductor memory cell 210. The cell 210 comprises a semiconductor substrate 212, such as silicon. The substrate 212, in one embodiment, can be a P–type silicon substrate with a typical doping level range from 5 to 50 ohm-cm, depending on the level of scaling.

Within the substrate 212 are defined a source region 216 and a drain region 214 with a channel region 218 therebetween. Disposed over the source region 216, channel region 218, and drain region 214 is a first layer 220 of insulating material, on the order of, e.g., 70–200 angstrom of thickness. The first layer 220 can be made using a suitable material including silicon dioxide, silicon nitride, silicon oxynitride, and others.

Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate.

A second insulating layer 225 has a first portion 224 disposed over the floating gate 222 and a second portion 226 disposed adjacent to the floating gate 222. The first portion 224 (top wall 224) of the second layer 225 is an insulating material and can be silicon dioxide, silicon nitride or silicon oxynitride and is on the order of, e.g., 500–3000 angstrom in thickness. The second portion 226 (side wall 226) of the second layer 225 is also of an insulating material and can be silicon dioxide, silicon nitride or silicon oxynitride and is on the order of, e.g., 150–1200 angstrom in thickness.

A control gate 229 has two portions: A first portion 228 is disposed over the top wall 224 of the second layer 225; a second portion 230 is disposed over the first layer 220 and is immediately adjacent to the side wall 226 of the second layer 225. The second portion 230 of the control gate 229 extends over a portion of the source region 216 and over a portion of the channel region 218.

To form the floating gate 222, a floating gate layer is formed overlying the surface of the first layer 220. The floating gate layer is commonly made of polysilicon and is also known as the poly 1 layer and the like. The gate polysilicon layer is often doped with an N type dopant such as phosphorus and the like. Doping can occur using POCl₃ diffusion, in-situ doping techniques, and implantation techniques. The gate polysilicon can be formed in a polycrystalline state or an amorphous state, which is later converted into the polycrystalline state. Amorphous silicon can be formed using low temperatures, e.g., 550 degrees C and less.

A masking step defines floating gate regions from the polysilicon floating gate layer, as shown by FIG. 6. In particular, the floating gate region is often formed by standard process steps such as masking, exposing, developing, etching, and others. The underlying oxide layer typically acts as an etch stop during the etching step, and often remains overlying both the source and drain regions 216 and 214. As illustrated, the floating gate 222 includes edges having substantially vertical sides and undercut regions. The undercut regions are made by way of plasma processing or wet processing in some cases. Plasma processing occurs using plasma etching tools. These tools can be configured to provide substantially vertical edges and undercut edges. Vertical edges are provided by using an anisotropic etching process. (The undercut edges occur using a slightly isotropic etch or plasma scattering.) Details of this etching process are described below.

Floating gate 252 is selectively formed to increase GCR in the present device of FIG. 6. Floating gate 252 includes a top surface 256. Floating gate also includes vertical edges 259 which extend from the top surface to under cut regions or slant edges 251 and 252. The slant edges extend negatively to the bottom surface 254 of the floating gate, which is defined overlying channel region 218. In some embodiments, slant edges may extend from the top surface to the bottom surface. That is, the floating gate may be substantially free from any vertical edges. In some embodiments, the slant edges can also be curved and do not need a linear profile. GCR increases (versus a floating gate with only conventional vertical edges) by increasing the relative area of the top surface (including vertical edges and slant edge 251) to the bottom surface, which bottom surface area has been reduced by the geometry of the slant edge 252. Accordingly, the surface of the floating gate that is capacitively coupled to the control gate is much larger than the surface of the floating gate that is capacitively coupled to the dielectric or tunnel oxide layer 220.

The dimensions of the cell 210 depend upon the process used. Thus, the foregoing dimensions for the first layer 220, side wall 226, and top wall 224 are only illustrative examples. Further, the material, for the first layer 220 and the second layer 225 are also illustrative examples only. In general, however, the dimensions of the cell 210 are such that electrons emanating from the source region 216 are injected onto the floating gate 222 by sensing an abrupt potential drop. Further, the dimensions of cell 210 are such that charges from the floating gate 222 are removed by tunneling through the Fowler-Nordheim mechanism through, for example, the second layer 225 onto the control gate 229. The particular manner of operating the cell 210 is as follows:

Initially, when it is desired to erase cell 210, a ground potential is applied to the drain 214 and to the source 216. A high-positive voltage, on the order of, e.g., +15 volts, is applied to the control gate 229. Charges on the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level in the vicinity of the threshold voltage of the MOS structure defined by the control gate 229, (on the order of approximately +1 volt, for example), is applied to the control gate 229. A positive high voltage, on the order of, e.g., +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential difference approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on.

When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the cell 210 is sensed to be programmed at the "0" state.

Figure 7:
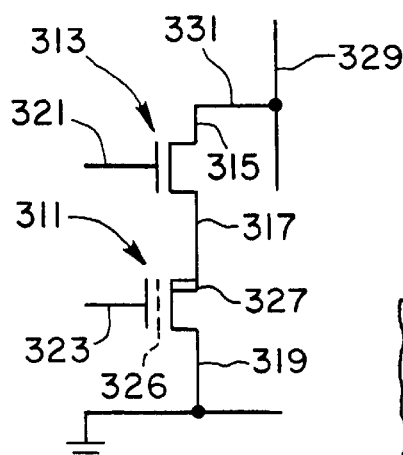

FIG. 7 is a schematic circuit diagram of a memory cell according to another specific embodiment of the present invention. With reference to FIG. 7, a memory cell of the present invention includes a memory device 311 and a field effect transistor 313 which allows selection of memory device 311 from among other memory cells. A drain 315 of selection transistor 313 is connected via a metal contact 331 to a read line 329. Selection transistor 313 and memory device 311 are connected together in series at a node 317 which serves as both a source for selection transistor 313 and a drain for memory device 311. A source 319 of memory device 311 connects to a common source line which in turn is coupled to ground. The gate 321 of selection transistor 313 is electrically connected to a word select line. The control gate 323 of memory device 311 is connected to a sense enable and program line. The circuit of FIG. 7 also includes in the memory device 311 a floating gate 326 (as represented in FIG. 7 by a dashed line), separated from the substrate by only a thin oxide layer. A program and erase implant 327 is provided in memory device 311 proximate to the device 317. The thin oxide layer together with the program and erase implant 327 permit rapid erasure of the memory device 311 electrically in a few milliseconds, instead of the usual twenty minutes or so with UV light with the thicker oxide layer under the floating gate of prior memory devices. The implant 327 also enables more efficient reprogramming to occur.

Figure 8:
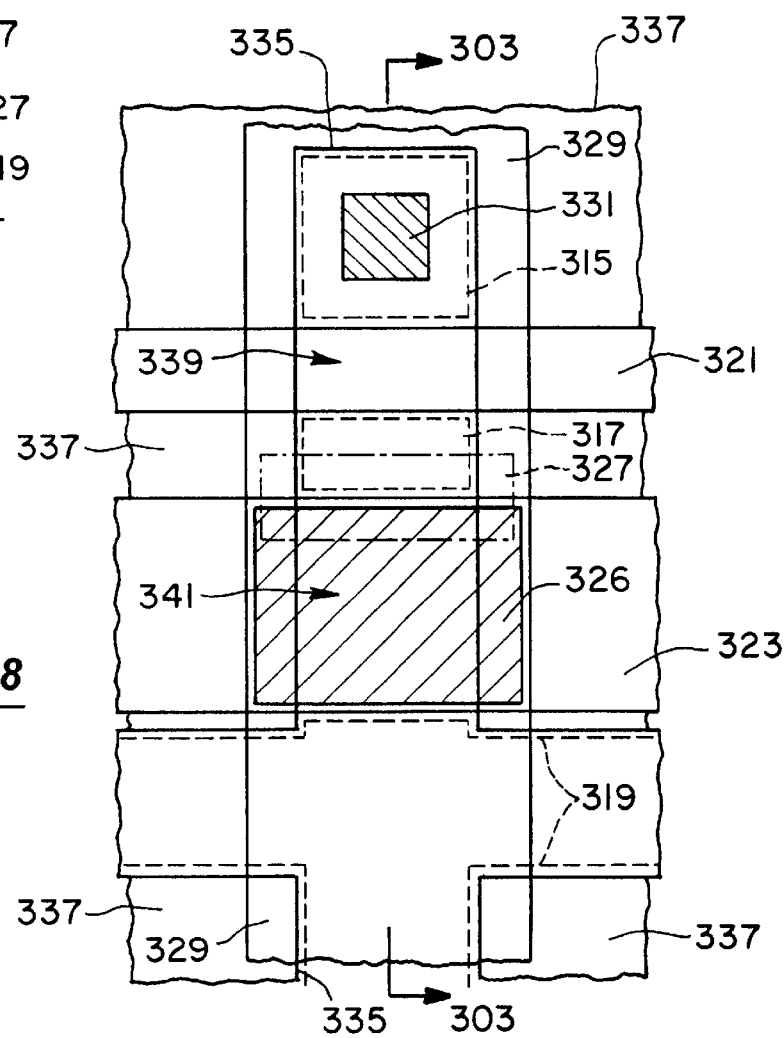
Figure 9:
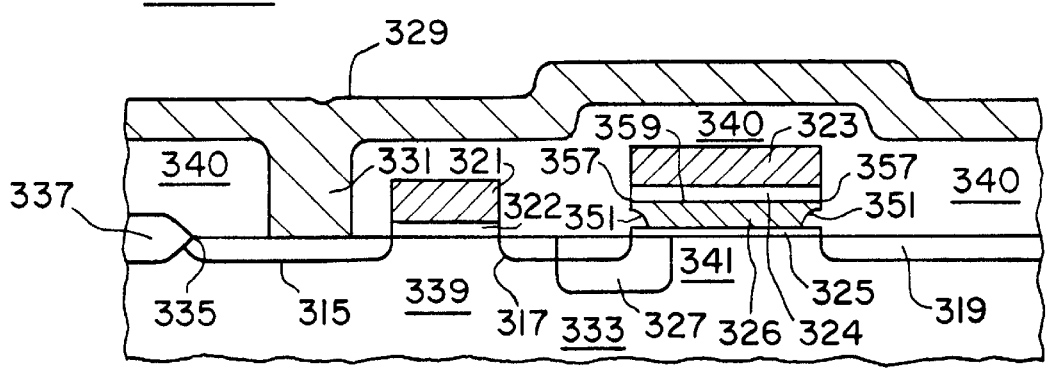

FIG. 8 is a top plan view of the memory cell of FIG. 7. FIG. 9 is a side sectional view taken along the line 303–303 in FIG. 8. With reference to FIGS. 8 and 9, a semiconductor chip having an array of memory cells comprises a semiconductor substrate 333 with active memory areas 335 therein. A field isolation oxide layer 337 is present over all nonactive areas outside of memory areas 335. Three spaced-apart implants 315, 317 and 319 are located in memory area 335 with channel areas 339 and 341 defined therebetween. Implant 315 forms a drain for the selection transistor 313 in the circuit of FIG. 7. Implant 317 forms a node functioning as both a source for selection transistor 313 and a drain for memory device 311 in FIG. 7. Implant 319 forms a source for memory device 311. Typically, substrate 333 is P-type and implants 315, 317 and 319 are N-type.

A program and erase implant 327 is also present in the active memory area 335 of substrate 333. Implant 327 overlaps part of node implant 317, extending into channel 341 between implants 317 and 319 of the memory device 311. Implant 327 is typically N-type and may be formed by either phosphorus or arsenic ion implantation followed by diffusion, as explained below. A thin dielectric layer 325 is disposed over channel 341 between implants 317 and 319, including over the portion of program and erase implant 327 which extends into channel 341, in active area 335. Typically, thin dielectric layer 325 is between 70 Angstrom and 150 Angstrom thick. Thin dielectric layer 325 can be made using a suitable material including silicon dioxide, silicon nitride, silicon oxynitride, and others. In a specific embodiment, thin dielectric layer 325 is a thin oxide layer 325. The remainder of active area 335 between field isolation oxide layer 337 has a dielectric layer 322 over it. The dielectric layer 322 can be an oxide layer, a nitride layer, or any combination thereof. In a preferred embodiment, the dielectric layer is a silicon nitride layer, which is sandwiched between two oxide layers. In a specific embodiment, the dielectric layer 322 is an oxide layer which is thicker than a thin oxide layer 325, typically about 300–500 Angstrom thick.

A polysilicon floating gate 326 is disposed on thin oxide layer 325 and extends over that portion of program and erase implant 327 that is beneath thin oxide layer 325. An inter-poly dielectric layer 324 is disposed on floating gate 326 and a polysilicon sense gate 323 is situated above interpoly oxide layer 324. The dielectric layer 324 can be an oxide layer, a nitride layer, or any combination thereof. A polysilicon select gate 321 is disposed above oxide layer 322 which overlies channel 339 between implants 315 and 317. The entire wafer is covered with an insulating glass layer 340 with vias for contacts 331 therein. A layer of conductive lines 329 is disposed on top of glass layer 340.

To form the floating gate 326, a floating gate layer is formed overlying the surface of the tin dielectric layer 325. The floating gate layer is commonly made of polysilicon and is also known as the poly 1 layer and the like. The gate polysilicon layer is often doped with an N type dopant such as phosphorus and the like. Doping can occur using POCl$_3$ diffusion, in-situ doping techniques, and implantation techniques. The gate polysilicon can be formed in a polycrystalline state or an amorphous state, which is later converted into the polycrystalline state. Amorphous silicon can be formed using low temperatures, e.g., 550 degrees C and less.

A masking step defines floating gate regions from the polysilicon floating gate layer, as shown by FIG. 9. In particular, the floating gate region is often formed by standard process steps such as masking, exposing, developing, etching, and others. The underlying oxide layer typically acts as an etch stop during the etching step, and in embodiments of the invention (not shown in FIG. 9) often remains overlying both the source and drain regions 319 and 317. As illustrated, the floating gate includes edges 357 having substantially vertical sides and undercut regions or slant edges 351. The undercut regions are made by way of plasma processing or wet processing in some cases. Plasma processing occurs using plasma etching tools. These tools can be configured to provide substantially vertical edges and undercut edges. Vertical edges are provided by using an anisotropic etching process. (The undercut edges occur using a slightly isotropic etch or plasma scattering.) Details of this etching process are described below.

Floating gate 326 is selectively formed to increase GCR in the present device of FIGS. 7–9. Floating gate 326 includes a top surface 359. Floating gate also includes vertical edges 357 which extend from the top surface to under cut regions or slant edges 351. The slant edges extend negatively to the bottom surface of the floating gate, which is defined overlying channel region 341. In some embodiments, slant edges may extend from the top surface to the bottom surface. That is, the floating gate may be substantially free from any vertical edges. In some embodiments, the slant edges can also be curved and do not need a linear profile.

GCR increases (versus a floating gate with only conventional vertical edges) by increasing the relative area of the top surface to the bottom surface, which bottom surface area has been reduced by the geometry of the slant edge(s) 351. Accordingly, the surface of the floating gate that is capacitively coupled to the control gate is larger than the surface of the floating gate that is capacitively coupled to the thin dielectric layer 325.

In a specific embodiment (not shown in a single drawing), the device resembles that shown in FIGS. 7–9, except that the stacked structure made up of control gate 323, interpoly dielectric layer 324, floating gate 326 in FIG. 9 is made in the form of the corresponding structure made up of control gate 111, dielectric layer 109, and floating gate 107, as shown in FIG. 2, according to the process as discussed above in connection with FIG. 2. In this specific embodiment, GCR increases in the manner as described in connection with FIG. 2.

Figure 10:
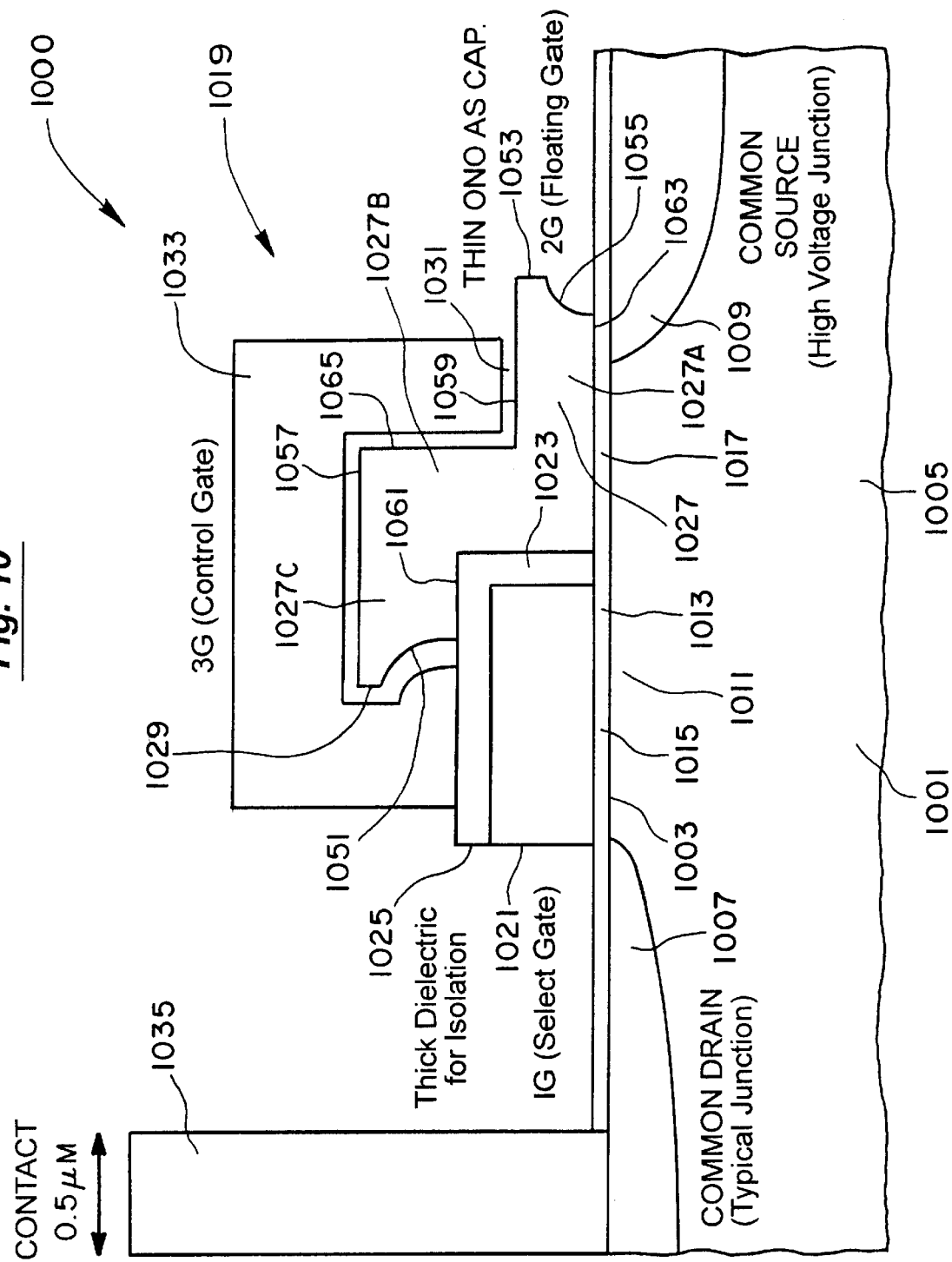

In a specific embodiment, the present invention can be applied to an improved flash memory cell 1000, such as the one shown in the simplified diagram of FIG. 10. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the tunnel dielectric layer is made of silicon oxynitride. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a POCl$_3$ compound or the like. Alternatively, the select gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, control gate, floating gate. The select gate also has a channel region ranging from about 0.2 micron and less or about 1.0 micron and less, but is not limited to these ranges. Additionally, the select gate has a thickness of about 1000 Angstroms and less and about 5000 Angstroms and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1027 also has an edge made up of a vertical portion 1029 and a cut out or slant portion 1051 overlying a region on the top surface of the select gate 1021. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A has a vertical edge 1053 and a cut out or slant edge 1055. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a POCl$_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying vertical edge 1029 and slant edge 1051 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a POCl₃ compound or the like. Alternatively, the control gate can be in-situ doped using a phosphorous bearing compound or the like. In further embodiments, the polysilicon layer can be laid in an amorphous state, which is later crystallized, rather than the polycrystaluine state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029 and slant edge 1051, upper horizontal region 1027C, and vertical region 1027B. Floating gate couples to the tunnel oxide through the lower horizontal region 1027A. Accordingly, control gate couples to the floating gate through at least two additional surface regions.

To form the split floating gate 1027, a floating gate structure with only substantially vertical edges (i.e., no slant edges 1051 or 1055) is formed overlying the surface of the dielectric layers 1017, 1023, and 1025 as discussed above and shown in FIG. 10. The floating gate layer is commonly made of polysilicon and is also known as the poly 1 layer and the like. The gate polysilicon layer is often doped with an N type dopant such as phosphorus and the like. Doping can occur using POCl₃ diffusion, in-situ doping techniques, and implantation techniques. The gate polysilicon can be formed in a polycrystalline state or an amorphous state, which is later converted into the polycrystalline state. Amorphous silicon can be formed using low temperatures, e.g., 550 degrees C and less.

A masking step defines the floating gate with substantially vertical edges 1029 and 1053 (without slant edges 1051 and 1055) as suggested by FIG. 10. In particular, the floating gate region is often formed by standard process steps such as masking, exposing, developing, etching, and others. The underlying oxide layer 1017 and 1025 typically acts as an etch stop during the etching step, and often remains overlying, e.g., the source regions 1009. As illustrated, the floating gate 1027 includes edges having substantially vertical sides and undercut regions. The undercut regions are made by way of plasma processing or wet processing in some cases. Plasma processing occurs using plasma etching tools. These tools can be configured to provide substantially vertical edges and undercut edges. Vertical edges are provided by using an anisotropic etching process. (The undercut edges occur using a slightly isotropic etch or plasma scattering.) Details of this etching process are described below.

Floating gate 1027 is selectively formed to increase GCR in the present device of FIG. 10. Floating gate 1027 includes top surfaces 1057 and 1059. Floating gate also includes vertical edges 1029 and 1053 which extend from the top surfaces to under cut regions or slant edges 1051 and 1055, as shown in FIG. 10. The slant edges 1051 and 1055 respectively extend negatively to the bottom surfaces 1061 and 1063 of the floating gate, which is defined overlying channel region 1011. In some embodiments, the slant edges may extend from the top surfaces to the bottom surfaces. That is, the floating gate may be substantially free from any vertical edges 1029 or 1053. In some embodiments, the slant edges can also be curved and do not need a linear profile. GCR increases (versus a floating gate with only conventional vertical edges) by increasing the relative area of the top surface (including vertical edge 1029 and a vertical edge 1065 and slant edge 1051) to the bottom surface 1063, the area of which bottom surface 1063 has been reduced by the geometry of the slant edge 1055. Accordingly, the surface of the floating gate that is capacitively coupled to the control gate is much larger than the surface of the floating gate that is capacitively coupled to the underlying oxide layer 1017.

In a specific embodiment, the present memory cell can be programmed and erased by placing voltages on selected gate structures. To program the floating gate or add electrons to the floating gate, selected voltages are applied to the gate structures and source/drain regions. For example, control gate is set at high voltage. Select gate is set at high voltage. The drain region is at high voltage and the source region is at low voltage. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiment described above is merely a single flash memory device with a novel gate structure. Integrated circuits include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices range from about 0.4 μm to 0.25 μm and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application.

Although the above descriptions have been described in terms of a stacked gate flash cell, a variety of other flash memory cells can be used. For example, the present invention can be applied to cells using processes called FETMOX, SIMOS, and others. Of course, the type of cell or process used depends upon the application.

While the above is a full description of the specific embodiments, various modifications, alternative constructions and equivalents may be used. For example, while the description above is in terms generally to a flash memory structure, it would be possible to implement the present invention embedded structures. For example, these embedded structures include, among others, microprocessors, microcontrollers, and the like. Additionally, the flash memory structure can be integrated into an application specific integrated circuit ("ASIC") or the like.

Therefore, the above description and illustrations should not be taken as limiting the scope of the present invention which is defined by the appended claims.

What is claimed is:

1. A semiconductor device, said device comprising:
   a substrate, said substrate including a layer of dielectric material overlying an active region; and
   a floating gate overlying said layer of dielectric material, said floating gate including a side wall having a slant edge, said slant edge defining a generally concave-shaped undercut edge, and wherein said side wall comprises substantially vertical edges above said slant edge.

2. The device of claim 1 wherein said floating gate layer comprises polysilicon.

3. The device of claim 1 further comprising a dielectric layer overlying said floating gate layer.

4. The device of claim 3 wherein said dielectric layer comprises a nitride layer, said nitride layer being sandwiched between oxide layers.

5. The device of claim 3 further comprising a control gate overlying said floating gate, said control gate being capacitively coupled to said floating gate through said dielectric layer.

6. The device of claim 1 wherein said floating gate layer comprises a first surface overlying said dielectric material and a second surface facing said dielectric layer.

7. The device of claim 1 wherein said second surface has a greater surface area than said first surface.

8. The device of claim 1 wherein said second surface has a greater surface area than said first surface by at least 30 percent.

9. The device of claim 1 wherein said slant edges are provided by an etching process, said etching process being selected from isotropic etching and plasma scattering etching.

10. In a semiconductor memory device, wherein the device includes a substrate, and said substrate includes a layer of dielectric material overlying an active region, a floating gate overlying said layer of dielectric material, said floating gate comprising:
    a first surface overlying said layer of dielectric material and a second surface spaced apart from the first surface defining a sidewall therebetween;
    said side wall having a substantially linear portion extending from the second surface and a slant edge extending from the substantially linear portion to the first surface, said slant edge defining a rounded, generally concave-shaped undercut edge.

11. The device of claim 3 further comprising a control gate at least partially overlying said floating gate, said control gate being capacitively coupled to said floating gate through said dielectric layer.

12. The device of claim 3 further comprising a control gate at least partially overlying said floating gate and partially overlying said substrate.

13. The device of claim 1 wherein said floating gate comprises a split floating gate.

14. The device of claim 13 further comprising a select gate overlying said substrate, said split floating gate partially overlying said substrate and partially overlying said select gate.

15. A semiconductor device, said device comprising:
    a substrate having an active region;
    a layer of dielectric material overlying said active region; and
    a floating gate layer overlying said layer of dielectric material, said floating gate layer comprising,
        a first surface overlying said dielectric material and adjacent a channel region of said substrate, said first surface having a first surface area;
        a second surface facing said layer of dielectric material, said second surface having a second surface area, said first surface and said second surface being spaced apart to form at least one floating gate layer side wall, said side wall having at least a portion comprising a slant edge;
    wherein said side wall slant edge comprises a generally concave-shaped undercut edge;
    wherein said side wall comprises a generally vertical portion from said second surface to a position intermediate said first and second surfaces, said slant edge extending from said position intermediate to said first surface; and
    wherein said side wall slant edge reduces said first surface area to an amount that is less than said second surface area to increase a gate coupling ratio towards 1 (one).

16. The device as in claim 1 wherein said undercut edge is visible in a cross-sectional depiction through a bit line of said device.

17. The device as in claim 15 wherein said slant edge extends from about said second surface to said first surface.

18. The device as in claim 10 wherein the substantially linear portion comprises a substantially vertical linear portion.

* * * * *